United States Patent [19]

Shirahata et al.

[11] Patent Number: 4,526,131

[45] Date of Patent: Jul. 2, 1985

[54] MAGNETIC RECORDING MEDIUM MANUFACTURING APPARATUS

[75] Inventors: Ryuji Shirahata; Masaru Sekine; Goro Akashi, all of Kanagawa, Japan

[73] Assignee: Fuji Photo Film Co., Ltd., Kanagawa, Japan

[21] Appl. No.: 587,420

[22] Filed: Mar. 8, 1984

[30] Foreign Application Priority Data

Mar. 8, 1983 [JP] Japan ................... 58-37907

[51] Int. Cl.³ .......................... C23C 13/10
[52] U.S. Cl. .................... 118/718; 118/726; 118/724; 427/132
[58] Field of Search ............. 118/718, 729, 726, 724, 118/728, 730; 427/255.5, 48, 128, 132

[56] References Cited

U.S. PATENT DOCUMENTS 2,975,753 3/1961 Hayes ........................ 118/718 X
3,249,087 5/1966 McGraw, Jr. ............... 118/718 X
3,342,633 9/1967 Bate et al. ...................... 427/132

FOREIGN PATENT DOCUMENTS 54-13996 of 1979 Japan ...................... 427/132
1420214 of 1976 United Kingdom .

Primary Examiner—John D. Smith
Assistant Examiner—Bernard F. Plantz
Attorney, Agent, or Firm—Sughrue, Mion, Zinn, Macpeak & Seas

[57] ABSTRACT

A magnetic recording medium manufacturing apparatus is comprised of a cooling rotary cylinder can and a small roller, arranged adjacent to each other, and with the small roller being swingable about the central axis of the can. A flexible endless belt is laid over the can and roller and carries a tape-shaped support. A ferromagnetic material, evaporated from an evaporation source disposed below the can and roller, is vacuum-deposited onto the tape-shaped support.

7 Claims, 3 Drawing Figures

MAGNETIC RECORDING MEDIUM MANUFACTURING APPARATUS

BACKGROUND OF THE INVENTION

This invention relates to a method of manufacturing a magnetic recording medium by vacuum-depositing a magnetic film on a tape-shaped support, such as a polymer product which is being moved.

Heretofore, a coated type magnetic recording medium has been extensively employed in the prior art. It is manufactured as follows: a magnetic paint is prepared by dispersing a magnetic powder such as an oxide magnetic powder of $\gamma$-$Fe_2O_3$, $\gamma$-$Fe_2O_3$ doped with Co, $Fe_3O_4$, $Fe_3O_4$ doped with Co, a berthollide compound of $\gamma$-$Fe_2O_3$ and $Fe_3O_4$, a berthollide compound doped with Co or $CrO_2$, or a ferromagnetic alloy powder essentially containing a transition metal of Co, Ni or Fe in an organic binder of vinyl chloride-vinyl acetate copolymer, stylene-butadiene copolymer, epoxy resin, or polyurethane resin. The magnetic paint thus prepared is applied to a nonmagnetic support, orientated and dried, to form a magnetic layer thereon.

Recently there has been a strong demand for high density recording data. This has led to development of "metal film" type magnetic recording media in which no organic binder is used, and in which the magnetic recording layer is a ferromagnetic metal film which is formed by a vapor deposition method such as a vacuum deposition method, a sputtering method, an ion plating method, or a plating method such as an electroplating method or an electroless deposition. Such metal film type magnetic recording media have become widely used.

In the conventional coated type magnetic recording medium, a metal oxide having a small saturation magnetization is used as the magnetic material, and the volume of the magnetic material content of the magnetic layer is only 30 to 50%. Accordingly, employment of the recording medium as a high-output, high-density recording medium is limited. Furthermore, the conventional recording medium is disadvantageous in that the manufacturing process is intricate and large auxiliary equipment is required in order to recover solvents or to prevent pollution.

The metal film type magnetic recording medium is advantageous in that ferromagnetic metal, higher in saturation magnetization than oxide magnetic material, can be provided in the form of a film without using a non-magnetic material such as an organic binder. For recording data with high density, the gap of recording and reproducing magnetic heads has been reduced to less than 1.0 $\mu$m. Accordingly, the tendency has been to reduce the recording depth of the magnetic recording layer. Thus, the metal film type magnetic recording medium in which the entire thickness of the magnetic film can be used for recording magnetic signals is excellent as a high-output, high-density recording medium. Especially advantageous is an oblique incidence vacuum deposition recording medium, in which vacuum deposition is carried out by obliquely applying a ferromagnetic material vapor beam to the surface of a support. Such a deposition technique uses a relatively simple procedure, equipment and mechanism, and the resulting films have excellent magnetic characteristics.

In a conventional pblique incidence vacuum deposition method, the vapor of ferromagnetic material from a ferromagnetic material evaporating source is applied at a predetermined incident angle or with a range of incidence angles to a tape-shaped support which is moved along the cylindrical wall of a cooling rotary cylinder can.

FIG. 1 shows the essential components of a magnetic recording medium manufacturing apparatus for practicing the conventional oblique incidence vacuum deposition method. A cooling rotary cylinder can 11 is disposed in a vacuum chamber (not shown) which is evacuated by suitable vacuum pumps (not shown). As the can 11 rotates, a tape-shaped support 12 supplied from a supply roll (not shown) is conveyed along the cylindrical wall of the can 11. A ferromagnetic material evaporating source 13 is provided below the can 11, so that the vapor beam of ferromagnetic material from the source 13 is applied to the moving tape-shaped support 12 in the region which is not covered by an oblique mask 15 provided under the can 11. Thus, the vapor beam of the ferromagnetic material is applied to the tape-shaped support 12 within a certain range of incident angles, with the surface of the support 12 within the angle $\alpha$ being vacuum-deposited with ferromagnetic material. In this operation, only the vapor beam 14 spreading with an angle $\alpha$ reaches the tape-shaped support 12.

However, in the above-described conventional apparatus, the ratio of the amount of ferromagnetic material reaching the tape-shaped support from the evaporating source to the amount of ferromagnetic material provided by the evaporating source, i.e., the efficiency of vacuum deposition, is low, which makes it difficult to utilize the conventional apparatus in the industrial field.

SUMMARY OF THE INVENTION

Accordingly, an object of this invention is to provide a magnetic recording medium manufacturing apparatus in which the above-described difficulties accompanying the conventional magnetic recording medium manufacturing apparatus have been eliminated and in which ferromagnetic materials can be efficiently vacuum-deposited onto the tape support.

The foregoing object and other objects of the invention have been achieved by the provision of a magnetic recording medium manufacturing apparatus which, according to the invention, comprises: a cooling rotary cylinder can; a small roller, the can and small roller being arranged in a vacuum atmosphere in such a manner that the small roller is adjacent to the can and is swingable about the central axis of the can; and a flexible endless belt laid over the can and the small roller, wherein a ferromagnetic material evaporated from an evaporation source disposed below the can and the small roller is vacuum-deposited on a tape-shaped support which is obliquely moved along the flexible endless belt.

BRIEF DESCRIPTION OF THE DRAWINGS

One example of a magnetic recording medium manufacturing apparatus according to the invention will be described with reference to the accompanying drawings, wherein.

DETAILED DESCRIPTION OF THE INVENTION

Figure 1:
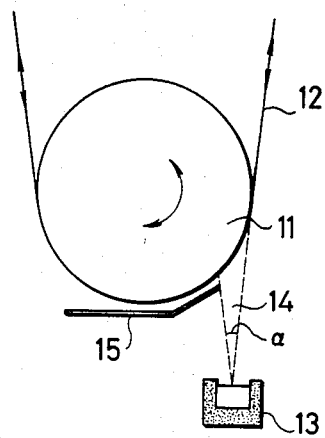
FIG. 1 is a side view showing the essential components of a conventional magnetic recording medium manufacturing apparatus.
Figure 2:
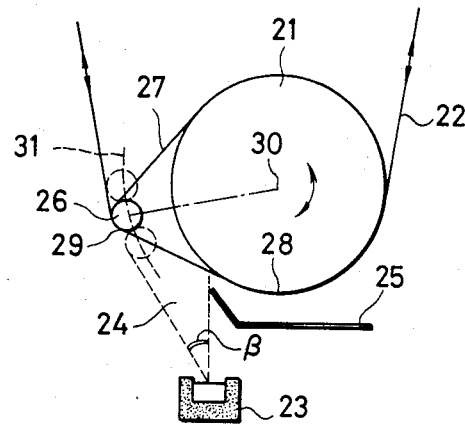
FIGS. 2 and 3 are side views showing the essential components of one example of a magnetic recording medium manufacturing apparatus according to this invention.

FIG. 2 shows the magnetic recording medium manufacturing apparatus of the invention. A cooling rotary cylinder can 21 is arranged in a vacuum chamber (not shown) which is evacuated by suitable vacuum pumps (not shown), and a small roller 26 is set adjacent to the can 21. A flexible endless belt 27 is laid over the can 21 and the roller 26. A tape-shaped support 22 supplied from a supply roll (not shown) is conveyed by the flexible endless belt 27, and a ferromagnetic material evaporating source 23 is disposed below the can 21 and the roller 26, so that the tape-shaped support 22 receives a vapor beam 24 from the ferromagnetic material evaporating source 23 while being conveyed by the endless belt 27. More specifically, the vapor beam 24 is obliquely applied to the tape-shaped support 22 which is moving through the region which is not covered by an oblique mask 25. In this operation, the vapor beam 24 provided by the evaporating source 23 and covering an angle $\beta$ is vacuum-deposited on the tape-shaped support 22. The angle $\beta$ is larger than the angle $\alpha$ in FIG. 1. That is, the efficiency of vacuum evaporation of the method of the invention is much higher than that of the conventional method. In the apparatus of the invention, the flexible endless belt 27 is sufficiently cooled while moving along the cooling cylinder can 21. Accordingly, the tape-shaped support 22, to which the vapor beam is applied, is cooled by the endless belt 27 while being conveyed.

Figure 3:
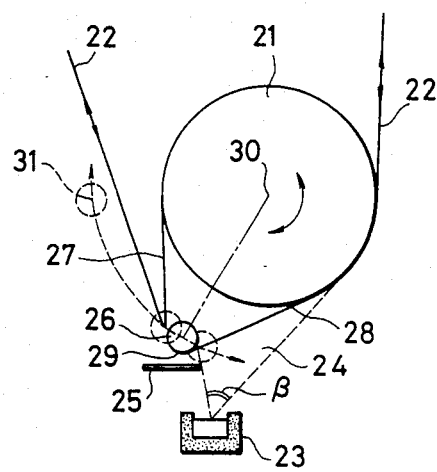

In the apparatus of the invention, the small roller 26 is so designed as to revolve about the central axis 30 of the cooling can 21 as indicated by the arrow 31. Accordingly, when the vapor beam is obliquely applied to the tape-shaped support, the incident angle of the vapor beam can be changed readily, and the relative position of the cooling can 21 and the small roller 26 can be significantly changed. It should be appreciated that this will significantly enhance the flexibility of operation of the present invention. In FIG. 2, the apparatus is set so that the lowest point 29 on the cylindrical wall of the small roller 26 is higher than the lowest point 28 on the cylindrical wall of the cooling rotary cylinder can 21. In FIG. 3, the apparatus is set so that the lowest point of the small roller 26 is lower than the lowest point 28 of the cooling rotary cylinder can 21.

In order for the vapor beam to be applied obliquely, with an incident angle of at least 30° to the tape-shaped support 22 which is being moved by the flexible belt 27, it is desirable that the radius r of the small roller 26 be smaller than one-third ($\frac{1}{3}$) of the radius r of the cooling rotary cylinder can 21.

Examples of the ferromagnetic metal for forming the magnetic film which is used for manufacturing the magnetic recording medium with the vacuum-depositing device according to the invention are metals such as Fe, Co, and Ni, and ferromagnetic alloys such as Fe-Co, Fe-Ni, Co-Ni, Fe-Co-Ni, Fe-Rh, Fe-Cu, Co-Cu, Co-Au, Co-Y, Co-La, Co-Pr, Co-Gd, Co-Sm, Co-Pt, Ni-Cu, Mn-Bi, Mn-Sb, Mn-Al, Fe-Cr, Co-Cr, Ni-Cr, Fe-Co-Cr and Fe-Co-Ni-Cr. The magnetic film should be thick enough to allow the magnetic recording medium to provide a sufficiently high output, and thin enough to record data with high density. Therefore, in general, the thickness of the magnetic film is 0.05 $\mu$m to 1.0 $\mu$m, preferably 0.1 $\mu$m to 0.4 $\mu$m. The tape-shaped support is a plastic support of polyethylene terephthalate, polyimide, polyamide, polyvinyl chloride, cellulose triacetate, polycarbonate, or polyethylene napthalate, or a metal belt of Al, aluminum alloy, Ti, titanium alloy or stainless steel.

The evaporation source may be heated by a resistance heating method, a laser beam heating method, a high frequency heating method or an electron beam heating method. In order to form the vapor beam, a method may be employed in which a wire-shaped or bar-shaped material is supplied to a heating source.

In the vacuum deposition, oxidizing gas, active gas or inert gas may be employed.

It is preferable that the flexible belt 27 be a metal belt made of Al, Cu, Ti or stainless steel.

We claim:

1. A magnetic recording medium manufacturing apparatus for depositing a material onto a tape-shaped support, said apparatus comprising:
    a first roller having a central axis;
    a second roller adjacent said first roller and swingable about the central axis of said first roller;
    transporting means for transporting said support between said first and second rollers;
    an evaporation source for evaporating said material for deposit onto said support; and
    wherein said second roller is swingable to a plurality of positions including a first position where the closest point on the cylindrical wall of said second roller to said evaporation source is closer to said evaporation source than the closest point on the cylindrical wall of said first roller, and a second position where the closest point on the cylinder wall of said second roller to said evaporation source is further from said evaporation source than the closest point on the cylindrical wall of said first roller.

2. An apparatus as claimed in claim 1, wherein said first roller is a cooling rotary cylinder can.

3. An apparatus as claimed in claim 1, further comprising an endless belt surrounding said first and second rollers.

4. An apparatus, as claimed in claim 2, wherein said can and second roller are arranged in a vacuum atmosphere.

5. An apparatus as claimed in claim 1, wherein said evaporation source is disposed below said first and second rollers.

6. An apparatus as claimed in claim 1, wherein said material is a ferromagnetic material.

7. An apparatus, as claimed in claim 2, wherein the radius of said second roller is less than the radius of said first roller.

* * * * *